(12) United States Patent
Zerphy et al.

(10) Patent No.: US 6,916,105 B2
(45) Date of Patent: Jul. 12, 2005

(54) OPTICAL ASSEMBLY FOR LIGHT EMITTING DIODE PACKAGE

(76) Inventors: Byron L. Zerphy, 6266 Sauteme Dr., Macungie, PA (US) 18062; Eric J. Zerphy, 3175 Watermille Dr., Macungie, PA (US) 18062

( * ) Notice: Subject to any disclaimer, the term of this patent is extended or adjusted under 35 U.S.C. 154(b) by 8 days.

(21) Appl. No.: 10/400,691

(22) Filed: Mar. 28, 2003

(65) Prior Publication Data

US 2004/0190290 A1 Sep. 30, 2004

(51) Int. Cl.[7] .............................................. H01R 33/00
(52) U.S. Cl. ....................... 362/226; 362/255; 362/311; 362/455
(58) Field of Search ................................ 362/249, 800, 362/311, 368, 396, 382, 455, 370, 353, 296, 255, 226; 313/498–500, 512; 257/98–100

(56) References Cited

U.S. PATENT DOCUMENTS 4,195,330 A * 3/1980 Savage, Jr. ................. 362/226
5,174,649 A 12/1992 Alston

* cited by examiner

*Primary Examiner*—Sandra O'Shea
*Assistant Examiner*—Guiyoung Lee
(74) *Attorney, Agent, or Firm*—Finnegan, Henderson, Farabow, Garrett and Dunner, LLP

(57) ABSTRACT

An optical assembly for use with one or more LED packages for capturing and redirecting light. The optical assembly can include an optical component and an alignment structure connected to the optical component for aligning the optical component to the LED package.

17 Claims, 7 Drawing Sheets

OPTICAL ASSEMBLY FOR LIGHT EMITTING DIODE PACKAGE

FIELD OF THE INVENTION

The present invention relates to optical assemblies and, more particularly, to optical assemblies that redirect light from an LED package or a plurality of LED packages.

BACKGROUND OF THE INVENTION

A light-emitting diode (LED) can be a semiconductor device that emits light when an electric current passes through it. LEDs are used in a wide variety of electronic devices. LEDs are typically sold in packages that include leads for connecting to an electrical source, an LED die for generating light, a casing, and an integral lens. These LED packages are then incorporated into various applications, such as signs or traffic signals.

Although LED packages are available in a variety of standard beam patterns, LED packages are not normally capable of capturing and focusing all of the light output from the LED die into a concentrated narrow beam, as may be desired for a signaling device or a high intensity display. Also, standard LED packages cannot normally produce light beams that are broad in one direction and narrow in another, nor produce beam patterns that are extremely broad (e.g. 180 degrees) in one or more directions with uniform or varying intensities over beam-width. Furthermore, most LED packages tend to "leak" light by allowing a portion of the radiated light from the die to radiate outside of the primary radiation pattern of the device.

SUMMARY OF THE INVENTION

It is therefore an object of the present invention to provide an optical assembly for use with an LED package to capture, redirect, and focus light from an LED package. The optical assembly can include an optical component for redirecting light from the LED package to suit a given optical application. The optical assembly can also include an alignment structure connected to the optical component for aligning the optical assembly with respect to the LED package so that the optical component maintains a substantially fixed position with respect to the LED package.

It is also an object of the present invention to provide an optical assembly for use with a plurality of LED packages. The optical assembly can include a plurality of optical components connected together. Each of the optical components can redirect light from one of the LED packages. In addition, an alignment structure can be attached to each optical component for aligning the optical component with respect to its corresponding LED package so that each optical component maintains a substantially fixed position with respect to its corresponding LED package.

BRIEF DESCRIPTION OF THE DRAWINGS

The accompanying drawings, which are incorporated in and constitute a part of this specification, illustrate several embodiments of the invention and together with the description, serve to explain the principles of the invention. In the drawings.

DETAILED DESCRIPTION OF THE PREFERRED EMBODIMENTS

Figure 1:
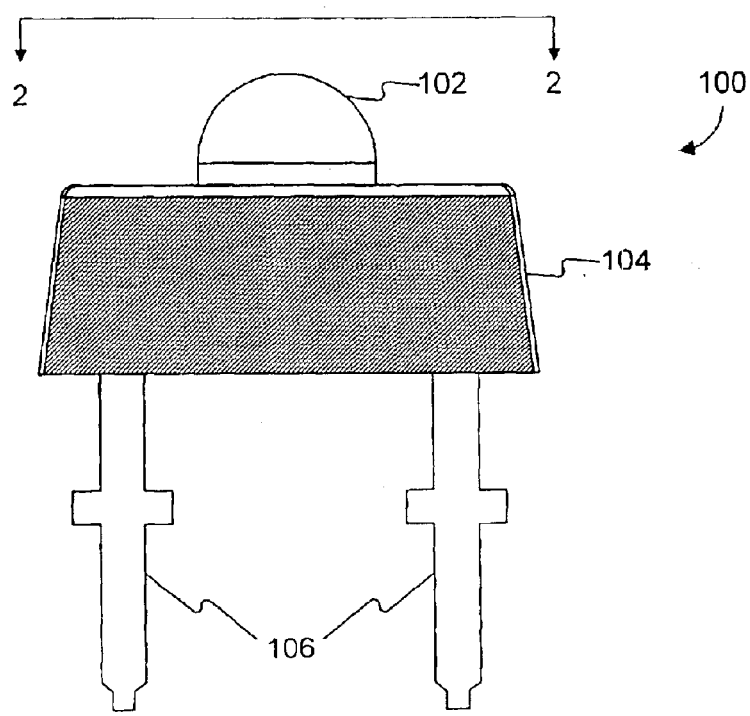
FIG. 1 depicts an illustrative embodiment of an LED package consistent with this invention.
Figure 2:
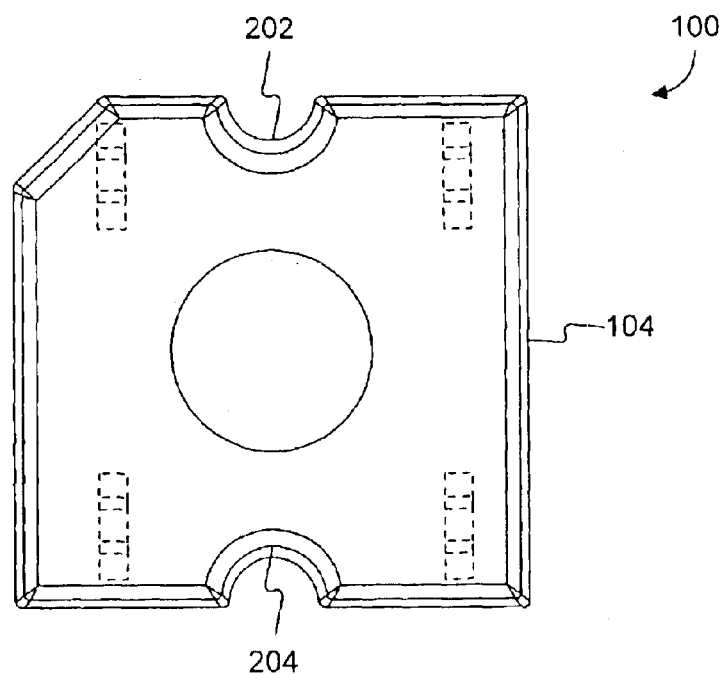
FIG. 2 depicts a top view of the LED package depicted in FIG. 1, taken along line 2—2, consistent with this invention.

FIG. 1 shows illustrative LED package 100 consistent with this invention. Package 100 can be an industry standard LED package known as the "Super Flux" LED package. The Super Flux LED package provides a high optical output with a relatively low amount of heat generation and a minimal required electrical energy input. It is typically used in applications where high levels of monochromatic light are desired from a very small package that does not generate heat and consumes very little power. Package 100 can include integral lens 102, LED body 104 for housing the LED die (not shown), and LED leads 106. The LED die can be the semiconductor within LED body 104 that emits the light through the integral lens 102. FIG. 2 is a top view of LED package 100. As shown, LED body 104 includes indentations 202 and 204 on opposite sides.

Figure 3:
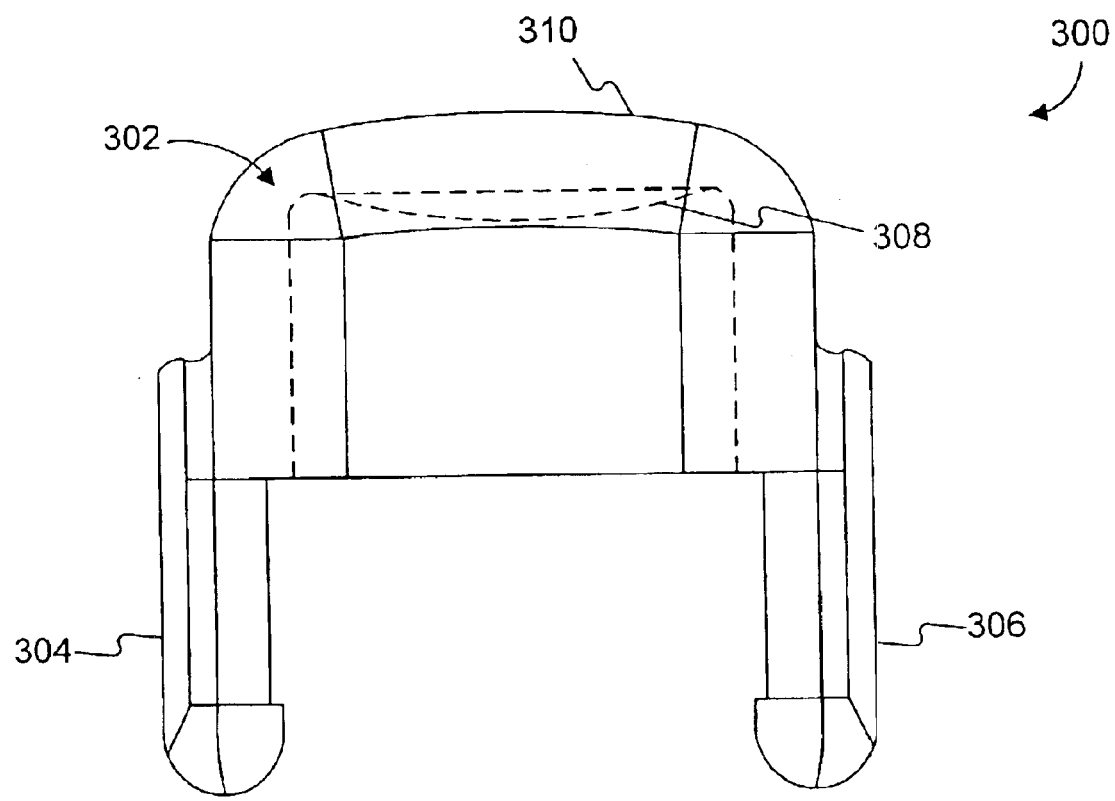
FIG. 3 depicts an illustrative embodiment of an optical assembly consistent with this invention.

FIG. 3 depicts illustrative optical assembly 300 for use with LED package 100 consistent with the present invention. Optical assembly 300 can include optical component 302 and one or more alignment structures, which, in this embodiment, consists of elongate members 304 and 306. The alignment structure can be a structure that attaches optical component 302 to LED package 100, such that optical component 302 can maintain a substantially fixed position with respect to LED package 100 during LED operation. In another embodiment, the alignment structure can include a single piece of material, which need not be elongated, that secures optical component 302 to LED package 100.

Optical component 302 can include internal optical surface 308 and external optical surface 310 for reflecting and/or refracting light from LED package 100. Surfaces 308 and 310 may be convex, concave, planar, or any combination thereof, depending upon the desired shape of the output beam. In one embodiment, optical component 302 can substantially cover the top of LED package 100. Accordingly, optical component 302 is able to capture a relatively large percentage of the light emitted by LED package 100 and redirect the light as needed. In one embodiment, optical assembly 300 can be manufactured from a single piece of refractive material, such as plastic (e.g. acrylic or polycarbonate). In general, however, optical component 302 consistent with this invention may be made of any optically suitable material that transmits, refracts, or reflects the light radiated by the LED package. The material can be optically stable under a wide temperature range and resistant to UV radiation. Elongate members 304 and 306 may be made of the same or different material as the optical component. In one embodiment, the materials are selected to have the appropriate mechanical properties to, for example, minimize a mismatch of thermal expansion coefficients.

Figure 4:
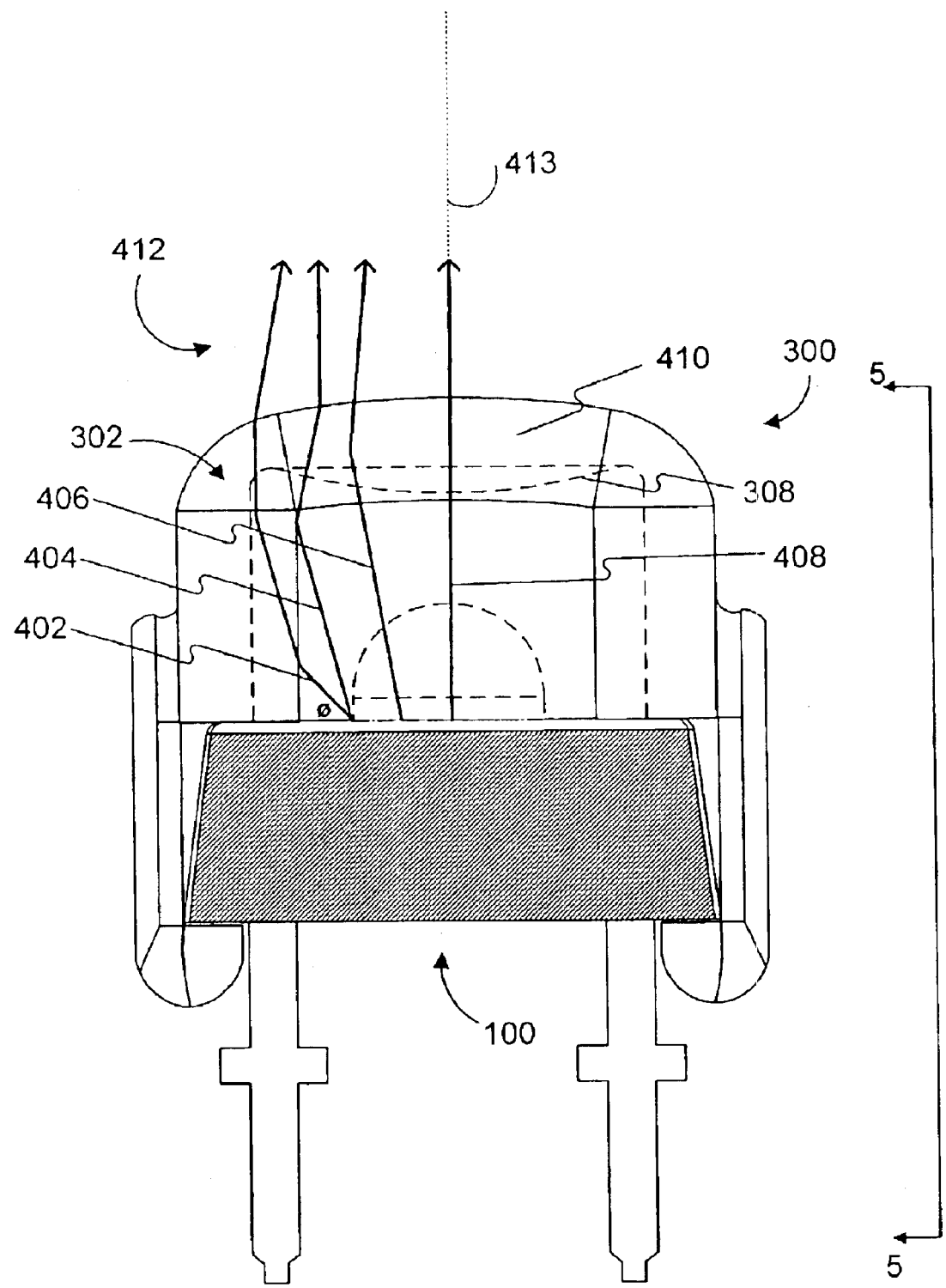
FIG. 4 depicts a side view of an illustrative embodiment of an optical assembly attached to an LED package and an illustrative ray diagram consistent with this invention.

FIG. 4 shows illustrative LED package 100 and optical assembly 300, as well as a ray diagram, consistent with the present invention. As shown in FIG. 4, the light from LED package 100 can be reflected and refracted by optical assembly 300 to capture as much light as possible and to redirect it for any desirable application, such as for a sign or display device. Light ray 402, for example, can be emitted by LED package 100 at shallow angle φ and could be blocked or otherwise wasted without using optical assembly 300. Because optical component 302 of optical assembly 300 substantially covers LED package 100, optical component 302 can capture light ray 402 and refract it back toward front 410 of optical component 302, which contributes to output beam 412.

Light ray 404 can also be emitted at a shallow angle (not shown) and could also be blocked or otherwise wasted without use of optical assembly 300. Internal optical surface 308 can reflect the light into front 410 of optical component 302, which can contribute to output beam 412. Similarly, optical component 302 can converge light ray 406 toward main optical beam 412 to narrow and amplify beam 412. Light ray 408, if emitted along central axis 413 of beam 412, is unaffected by optical component 302, which may have a surface that is normal to beam 412. Thus, the maximum amount of light emitted from the LED package can be captured and redirected by the optical component into a narrow and amplified light beam. It will be appreciated that optical component 302 may redirect the light to produce any desired output pattern. It will also be appreciated that FIG. 4 only shows a small number of many possible light rays for illustrative simplicity.

Figure 5:
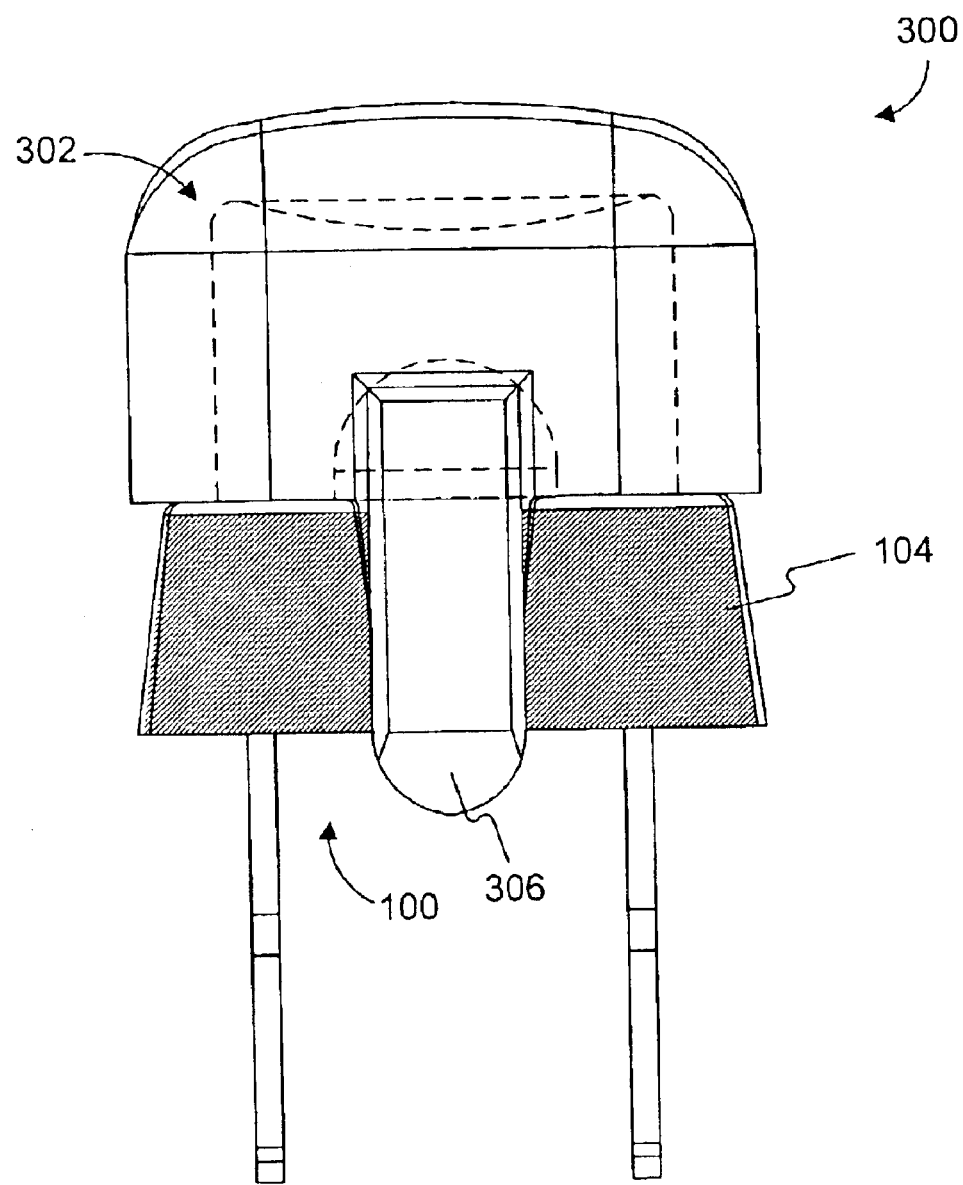
FIG. 5 depicts another side view of the optical assembly and LED package shown in FIG. 4, taken along line 5—5 of FIG. 4, consistent with this invention.

As shown in FIGS. 4 and 5, elongate members 304 and 306 can fit into indentations 202 and 204 of LED 100 and mechanically attach to LED body 104. In this embodiment, elongate members 304 and 306 can include a bottom portion that snaps underneath LED body 104 to secure optical assembly 300 to LED package 100. In general however, when an LED package does not include indentations (e.g., indentations 202 and 204), an alignment structure consistent with this invention may be attached to the LED package using an adhesive or a secondary mechanical attachment device, such as a metal clip. When elongate members 304 and 306 are mechanically attached to LED body 104, or any other part of LED package 100, optical component 302 can be in a substantially fixed position with respect to LED package 100. Accordingly, optical component 302 remains optically aligned with LED package 100, even if LED package 100 is moved due to mechanical vibrations or stresses.

Figure 6:
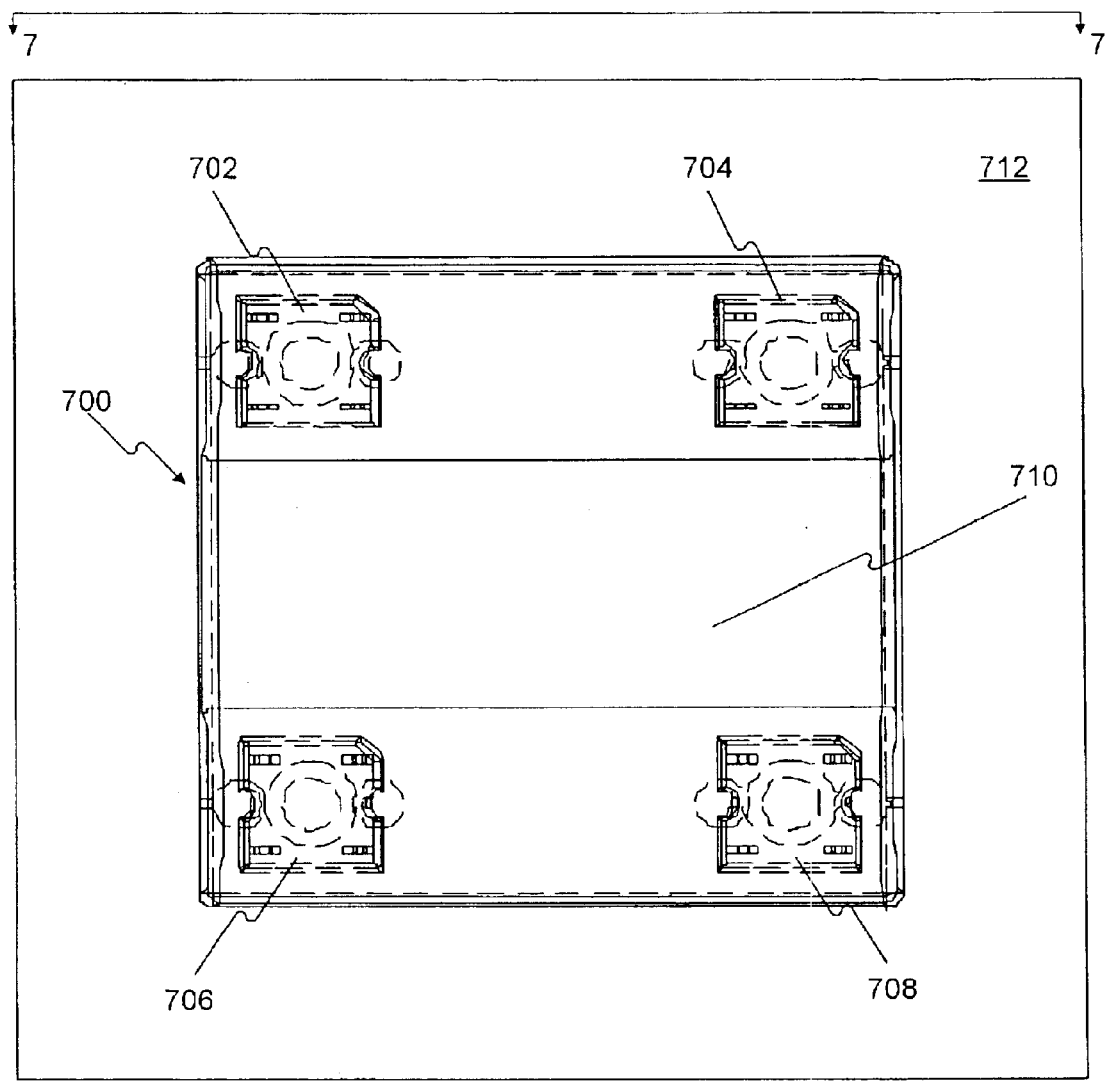
FIG. 6 depicts a top view of an illustrative embodiment of an optical assembly for use with a plurality of LED packages consistent with this invention.
Figure 7:
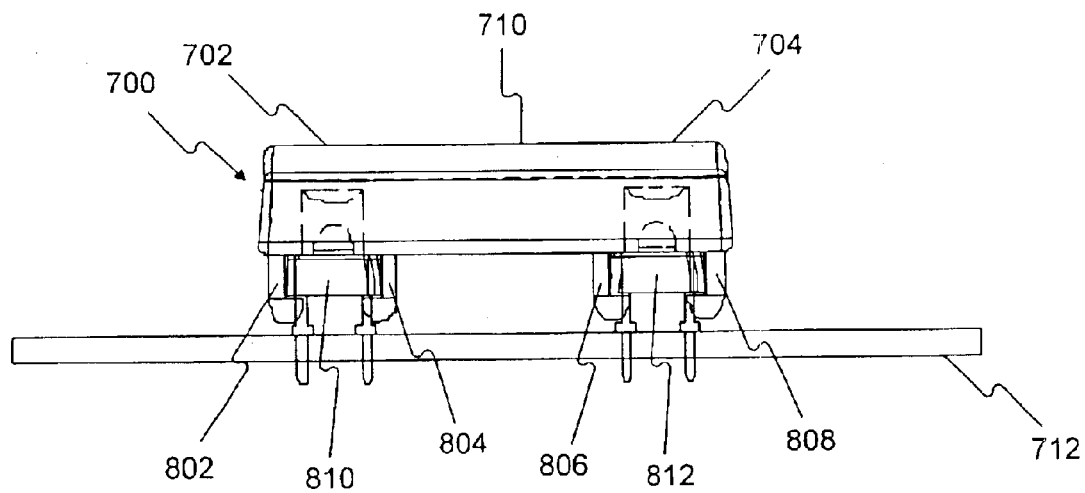
FIG. 7 depicts a side view of the optical assembly and LED packages of FIG. 6, taken along line 7—7, consistent with this invention.

FIGS. 6 and 7 show an illustrative embodiment of optical assembly 700 for use with a plurality of LED packages consistent with the present invention. Optical assembly 700 can be attached to a plurality of LED packages, which can be attached to circuit board 712. As shown in FIG. 6, optical assembly 700 can include four optical components 702, 704, 706, and 708, each for redirecting light from an LED package. Optical components 702, 704, 706, and 708 can be connected to each other through connector portion 710. In an alternative embodiment, one or more of optical components 702, 704, 706, and 708 may be connected to each other in an array without any connector portion 710.

As shown in FIG. 3, for example, an alignment structure can include any number of elongate members for attachment to each optical component. FIG. 7, for example, shows elongate members 802 and 804 extending from optical component 702 and elongate members 806 and 808 extending from optical component 704 (elongate members extending from optical components 704 and 706 are not shown in FIG. 7). As previously explained, elongate members 802 and 804 can be used to attach optical component 702 to LED package 810 and elongate members 806 and 808 can be used to attach optical component 704 to LED package 812 in any convenient manner. Optical components 702 and 704 may be integral or connected through the connector portion 710.

Figure 8:
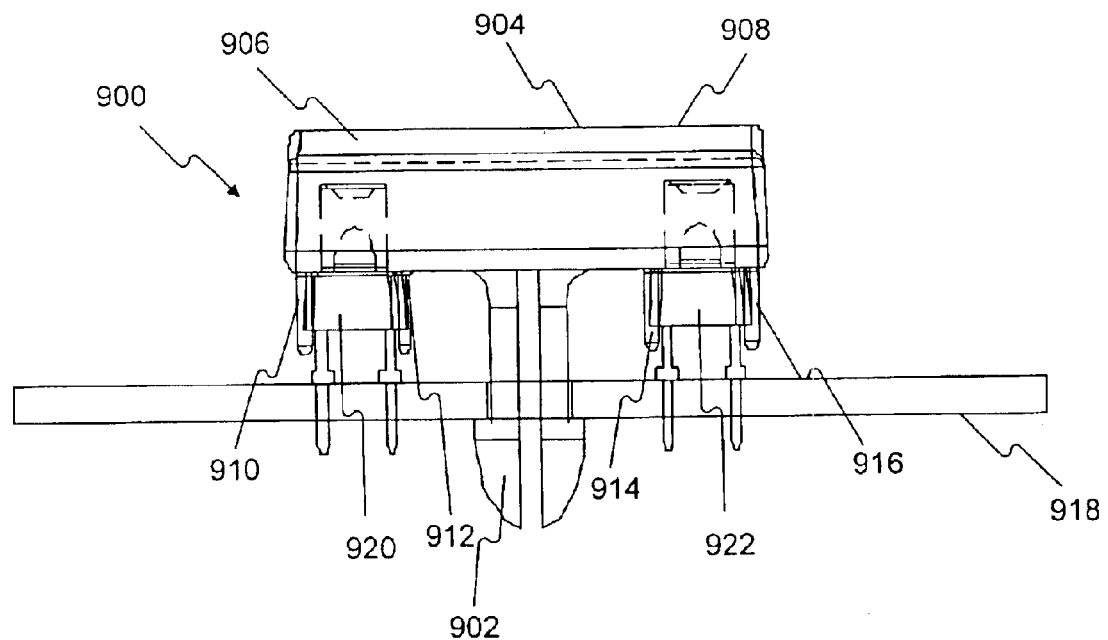
FIG. 8 depicts another illustrative embodiment of an optical assembly for use with a plurality of LED packages consistent with this invention.

FIG. 8 depicts another illustrative embodiment of an optical assembly for use with a plurality of LED packages. The embodiment of FIG. 8 can include protrusion 902 for attaching optical assembly 900 to circuit board 918. In this embodiment, protrusion 902 can include two clips that snap onto circuit board 918. Protrusion 902 may attach to circuit board 918 by alternative means, such as with an adhesive or with a secondary attachment device. Protrusion 902 can attach to connector portion 904, or any other part of optical assembly 900. As previously explained, elongate members 910, 912, 914, and 916 can be pins that fit into indentations of LED packages 920 and 922 to align optical components 906 and 908 with LED packages 920 and 922, respectively.

Elongate members 910, 912, 914, and 916 do not necessarily secure optical assembly 900 to LED packages or to circuit board 918. This is because optical assembly 900 may already be secured to circuit board 918 by protrusion 902. Thus, optical components 906 and 908 can be connected to each other and to protrusion 902 through connector portion 904. In this embodiment, optical components 906 and 908, connector portion 904, and protrusion 902 can be fabricated from one or more convenient materials, such as a single piece of clear optically-suitable plastic, such as acrylic or polycarbonate.

Additional embodiments for optical assemblies involving different numbers of optical components, protrusions, indentations, elongate members, LED packages, connector portions, etc. will be evident to one skilled in the art.

While the present invention has been described with reference to a few specific embodiments, the description is illustrative of the invention and is hot to be construed as limiting the invention. Various modifications may occur to those skilled in the art without departing from the true spirit and scope of the invention as defined by the appended claims.

What is claimed is:

1. An optical assembly for use in conjunction with an LED package comprising:

an optical component for redirecting and capturing light from said LED package to form a particular light beam pattern; and an alignment structure connected to said optical component, said alignment structure comprising at least two elongate members configured to optically align said optical component with respect to said LED package such that said optical component maintains a substantially fixed position with respect to said LED package allowing said optical component to form said particular light beam pattern.

2. The optical assembly of claim 1, wherein the optical assembly is an integral piece of optical material.

3. The optical assembly of claim 1, wherein the alignment structure comprises at least one elongate member.

4. The optical assembly of claim 1, wherein the package comprises a lens, and wherein the optical component substantially covers the LED package.

5. The optical assembly of claim 1, wherein the alignment structure is connected integrally with the optical component.

6. An optical assembly for use in conjunction with a plurality of LED packages comprising:
- a plurality of connected optical components for redirecting and capturing light from each of the plurality of LED packages to form a particular light beam pattern, the plurality of connected optical components being associated with each of the plurality of packages,
- at least one alignment structure connected to at least one of the plurality of optical components, said alignment structure comprising at least two elongate members for optically aligning each of the optical components with the associated LED package such that each of the optical components maintains a substantially fixed position with respect to the associated LED package allowing each of the optical components to form the particular light beam pattern.

7. The optical assembly of claim 6, wherein the optical assembly is an integral piece of optical material.

8. The optical assembly of claim 6, wherein the alignment structure comprises at least one elongate member.

9. The optical assembly of claim 6, wherein the one optical component substantially covers at least one of the LED packages.

10. The optical assembly of claim 6, further comprising a connector portion for connecting the optical components.

11. The optical assembly of claim 10, further comprising a protrusion configured to connect the connector portion to a circuit board.

12. The optical assembly of claim 11, wherein the optical assembly is an integral piece of optical material.

13. The optical assembly of claim 11, wherein the protrusion comprises a plurality of clips for snapping the optical assembly onto the circuit board.

14. The optical assembly of claim 6, wherein the alignment structure is connected integrally with the optical component.

15. A modified LED package comprising:
- an LED package comprising:
  - an LED body,
  - a set of leads, and
  - an integral lens; and
- an optical assembly secured to the LED package comprising:
  - an optical component for redirecting and capturing light from the LED package to form a particular beam pattern, and
  - an alignment structure connected to the optical component, said alignment structure comprising at least two elongate members configured to optically align the optical component with respect to the LED package such that the optical component maintains a substantially fixed position with respect to the LED package allowing the optical component to form the particular beam pattern.

16. The optical assembly of claim 15, wherein the at least one elongate member is configured to attach to the LED package.

17. The optical assembly of claim 15, wherein the alignment structure is connected integrally with the optical component.

* * * * *